United States Patent
Park et al.

(10) Patent No.: US 7,031,204 B2
(45) Date of Patent: Apr. 18, 2006

(54) LOW POWER REGISTER APPARATUS HAVING A TWO-WAY GATING STRUCTURE AND METHOD THEREOF

(75) Inventors: Hung-Su Park, Seoul (KR); Ho-Seung Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 13 days.

(21) Appl. No.: 10/891,131

(22) Filed: Jul. 15, 2004

(65) Prior Publication Data

US 2005/0013177 A1    Jan. 20, 2005

(30) Foreign Application Priority Data

Jul. 16, 2003  (KR) .................... 10-2003-0048895

(51) Int. Cl.
*G11C 7/00*   (2006.01)

(52) U.S. Cl. ................ 365/189.12; 365/189.02
(58) Field of Classification Search ........... 365/189.12, 365/189.02, 240
See application file for complete search history.

(56) References Cited

U.S. PATENT DOCUMENTS 6,731,548 B1 *  5/2004  Pax ................ 365/189.12

* cited by examiner

*Primary Examiner*—Vu A. Le
(74) *Attorney, Agent, or Firm*—Roylance, Abrams, Berdo & Goodman, L.L.P.

(57) ABSTRACT

A register apparatus and method for providing a two-way gating structure for receiving a write enable signal, a chip select signal, at least one read signal, and an address signal for a register. The apparatus and method comprise a two-way gating portion for generating a coded write address by AND-operating a first signal with the address signal, a coded read address by AND-operating a second signal with the address signal, and a reader activation signal by AND-operating the read signal with the second signal. The first and second signals are generated by AND-operating the chip select signal with the write enable signal and by AND-operating the chip select signal with an inverted write enable signal. A writer decodes the coded write address and generates write signals using the decoded write address and data received from a bus. A reader decodes the coded read address and generates data using data read from the register and the decoded read address.

10 Claims, 4 Drawing Sheets

LOW POWER REGISTER APPARATUS HAVING A TWO-WAY GATING STRUCTURE AND METHOD THEREOF

PRIORITY

This application claims the benefit under 35 U.S.C. § 119(a) of an application entitled "Low Power Register Apparatus Having Two-Way Gating Structure" filed in the Korean Intellectual Property Office on Jul. 16, 2003 and assigned Serial No. 2003-48895, the entire contents of which are incorporated herein by reference.

BACKGROUND OF THE INVENTION

1. Field of the Invention

The present invention relates generally to a register apparatus and method. In particular, the present invention relates to an apparatus and method for reducing power consumption through effective gating in a register module of a user core.

2. Description of the Related Art

Due to the recent widespread use of mobile communication technology, increasing the operation time of a mobile station (MS) through effective use of its limited power resources has become a significant issue. To meet this demand, various low power designs have been used for recently developed chips.

Multi-function chips typically include a Central Processing Unit (CPU)/Digital Signaling Processor (DSP) and peripheral devices. Each device is connected to other devices by bus interfaces. Usually, the peripheral devices are provided with register modules for communicating with the CPU. The CPU controls the peripheral devices performing predetermined operations through the register modules. Therefore, almost every user core is provided with a register module.

The register module has a write functionality for writing a register value by the CPU and a read functionality for enabling the CPU to read a particular signal. Under some circumstances, the register module has read and write functionality that allows a value written by the write action to be read directly by the read action. Typically, the register module can comprise write registers, read registers, and read and write registers in combination.

In a design flow of the register module of the user core, the register module is first described in a Hardware Description Language (HDL) according to its various interfaces and then synthesized into gate-level logics by a synthesis tool. Thus, a designer designs the register module for the user core by the HDL according to the design flow. Interconnections between the gate-level logics in designing the register module depend on how the HDL is described.

There is a typical register module having gate level logics created to operate in a one-way gating fashion by the synthesis tool. The register module gates a write address at a write operation using a chip select (CS) signal that activates the register module, thereby performing a gating function as intended by the designer. This register module comprises a writer and a reader.

As previously described, the typical gate level structure is created by synthesizing what the designer describes in HDL using its own optimization function, or by providing a HDL description using an option of a synthesis tool in consideration of the gate level structure before synthesizing and then synthesizing the HDL description. These two structures can be created using general HDL technology. The configuration of a register module that can be formed by the general HDL technology will be described below.

FIG. 1 illustrates the configuration of a register module of a conventional one-way gating structure. Referring to FIG. 1, the operation of each block for read and write functionality when a CS signal is enabled for the register module will be described separately from its operation when the CS signal is disabled. Gating logics in the register module are implemented as AND gates.

A write operation when the CS signal, CS is enabled for the register module will now be described. At a write operation, a write enable signal, WRITE_enable is enabled.

When an input address signal, ADDR is enabled, a common address decoder 102 is activated. If both CS and WRITE_enable are enabled, that is, the output of an AND gate 100 is activated, the output of the common address decoder 102 activates a write address decoder 103 via a one-way gating logic 101. Thus, a load enable signal at an address corresponding to ADDR is enabled, thereby writing a value BUS_IN in a corresponding register of a write register 105.

Regarding the operation of a reader 110 during the write operation, when ADDR is enabled, the common address decoder 102 is activated. The output of the common address decoder 102 is provided directly to a read address decoder 104 without passing through a gating logic and activates logics of the read address decoder 104. If the read address decoder 104 uses an address corresponding to ADDR, corresponding AND gates in a read gating logic 106 are enabled. Therefore, in the case of a read and write address, read data is provided to a bus output multiplexer (MUX) 107 and activates the MUX 107.

A gating logic 108, which has been activated by CS, outputs a bus output signal BUS_OUT in response to the output of the bus output MUX 107. BUS_OUT is not used at the next stage (not shown) because the register module is currently in a write state. That is, many logics corresponding to the reader 110 operate unnecessarily during the write operation in the register module illustrated in FIG. 1.

A read operation when CS is enabled will now be described. At a read operation, WRITE_enable is disabled.

When ADDR is enabled, the common address decoder 102 is activated. The output of the common address decoder 102 is provided directly to the read address decoder 104 without passing through a gating logic and activates a corresponding AND gate in the read gating logic 106. In the case of a read and write address, read data is provided to the bus output MUX 107 and activates it.

The gating logic 108, which has been activated by CS, outputs BUS_OUT in response to the output of the bus output MUX 107. BUS_OUT is used as a at the next stage because the register module is currently in a read state.

Meanwhile, regarding the operation of a writer 109 during the read operation, when ADDR is enabled, the common address decoder 102 is activated. Although CS is enabled, WRITE_enable is not. Thus, neither the output of an AND gate 100 nor the one-way gating logic 101 is activated. That is, the common address decoder 102 is activated, but the read address decoder 103 is not. Thus, the one-way gating logic 101 activates none of the logics of the writer 109.

Finally, the operation of each block when CS is not enabled will now be described.

If another register module writes or reads, ADDR is enabled, activating the common address decoder 102. However, since CS is not enabled, the output of the AND gate 100 is not activated. Thus, the one-way gating logic 101 is not activated either and thus none of the logics of the writer 109 operate.

In the reader 110, when the common address decoder 102 is activated, the output of the common address decoder 102 is directly provided without passing though the gating logic and activates the logics of the read address decoder 104. Then, the read gating logic 106 is activated and in the case of a read and write address, read data is provided to the bus output MUX 107. While the bus output MUX 107 is activated by the output of the read gating logic 106, the gating logic 108 is not activated by CS. As a result, BUS_OUT is not output.

As described above, the logics before the gating logic 108 in the reader 110 operate using CS. The operation results in unwanted continuous power consumption which was not intended to occur by the designer.

FIG. 2 illustrates the configuration of another register module of the conventional one-way gating structure. Referring to FIG. 2, the operation of each block for read and write functionality when CS is enabled for the register module will be described separately from its operation when CS is disabled. Gating logics in the register module are implemented as AND gates.

A write operation when CS is enabled for the register module will now be described. At a write operation, WRITE_enable is enabled.

When ADDR is enabled, a gating logic 200 activates a common address decoder 202 using CS and ADDR. An AND gate 211 AND-operates CS and WRITE_enable. The outputs of the AND gate 211 and the common address decoder 202 activates a one-way gating logic 203, thereby activating a write address decoder 204. Thus, a load enable (LE) signal, at an address corresponding to ADDR is enabled, thereby writing a value BUS_IN in a corresponding register of a write register 206.

Regarding the operation of a reader 210 during the write operation, the output of the common address decoder 202 is provided directly to a read address decoder 205 without passing through a gating logic and activates the decoders logics. If the read address decoder 205 uses an address corresponding to ADDR, corresponding AND gates in a read gating logic 207 are enabled. Therefore, in the case of a read and write address, read data is provided to a bus output MUX 208.

The bus output MUX 208 outputs BUS_OUT in response to the output of the read gating logic 207. As stated earlier, BUS_OUT is not used as at the next stage (not shown) because the register module is currently in a write state. Also in the register module of FIG. 2, many logics corresponding to the reader 210 operate during the write operation.

A read operation when CS is enabled will now be described. At a read operation, WRITE_enable is disabled.

When ADDR is enabled, the gating logic 200 activates the common address decoder 202 using CS and ADDR. The output of the common address decoder 202 is provided directly to the read address decoder 205 without passing through the gating logic and activates corresponding decoding logics and then a corresponding AND gate of the read gating logic 207. In the case of a read and write address, read data is provided to the bus output MUX 208.

The bus output MUX 208 outputs BUS_OUT in response to the output of the read gating logic 206. BUS_OUT is used at the next stage because the register module is currently in a read state.

Meanwhile, regarding the operation of a writer 209 during the read operation, when ADDR is enabled, the common address decoder 202 is activated. But since WRITE_enable is not enabled, an AND gate 211 to which WRITE_enable is applied does not activate the one-way gating logic 203. Thus, the write address decoder 204 is not activated. As noted, the one-way gating logic 203 does not operate the logics of the writer 209 during the read operation.

Finally, the operation of each block when CS is not enabled will now be described.

Because the gating logic 200 is not activated, even if ADDR is enabled, neither the writer 209 nor the reader 210 is activated. The gating logic 201 is gated by a read signal 0, read-signal_0 corresponding to "address 0" from the previous stage of the reader 210, which detects the operation of the reader 210 when ADDR is gated and not activated by the gating logic 200 at the front end of the common address decoder 202 from its operation when ADDR is gated and activated by the gating logic 200. This gating logic 201 prevents unnecessary outputting of BUS_OUT, read-signal_0 when CS is not enabled. This is because when ADDR is gated by the gating logic 200, a load enable signal corresponding to "address 0" is generated.

Accordingly, the gating logics 200, 201 and 211 are not activated by CS so that neither writer 209 nor the reader 210 operates in the structure of FIG. 2. As compared to the register module of FIG. 1, the register module of FIG. 2 does not cause unnecessary power consumption when CS is not enabled.

Both the register modules as described above experience unnecessary power consumption as many logics corresponding to the reader operate when CS is enabled. Although the register module illustrated in FIG. 2 prevents unnecessary power consumption when CS is not enabled, it still experiences unnecessary power consumption during a write operation.

As described above, the conventional one-way gating technology operates many logics in a reader during a write operation or when CS is not enabled, thereby causing unnecessary power consumption.

SUMMARY OF THE INVENTION

An object of the present invention is to substantially solve at least the above problems and to provide at least the advantages below. Accordingly, an object of the present invention is to provide an apparatus and method of preventing unnecessary power consumption in a register module of a user core.

Another object of the present invention is to provide a low power register apparatus and method for substantially reducing power consumption through effective two-way gating.

The above objects are achieved by providing a register apparatus and method having a two-way gating structure that receives a write enable signal, a chip select signal, at least one read signal, and an address signal for a register. In the register apparatus and method, a two-way gating portion generates a coded write address by AND-operating a first signal with the address signal, a coded read address by AND-operating a second signal with the address signal, and a reader activation signal by AND-operating the at least one read signal with the second signal. Here, the first signal is generated by AND-operating the chip select signal with the write enable signal, and the second signal is generated by AND-operating the chip select signal with an inverted signal of the write enable signal. A writer decodes the coded write address, generates write signals using the decoded write address and data received from a bus and outputs the write signals to the register. A reader decodes the coded read address, generates data using data read from the register and the decoded read address, and outputs the data to the bus.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail for conciseness.

The embodiment of the present invention provides an effective two-way gating technique that can overcome the problem of unnecessary power consumption in a register module of a user core.

The conventional register modules use a one-way gating method in which only a write address is gated by a write signal, except basic gating of a signal CS. On the other hand, the embodiment of the present invention uses a two-way gating method in which a read address as well as a write address is gated by a write signal. The two-way gating structure of the embodiment of the present invention can be implemented by performing a Hardware Description Language (HDL) description using an option of a synthesis tool according to a general design flow for a register module of a core.

Figure 1:
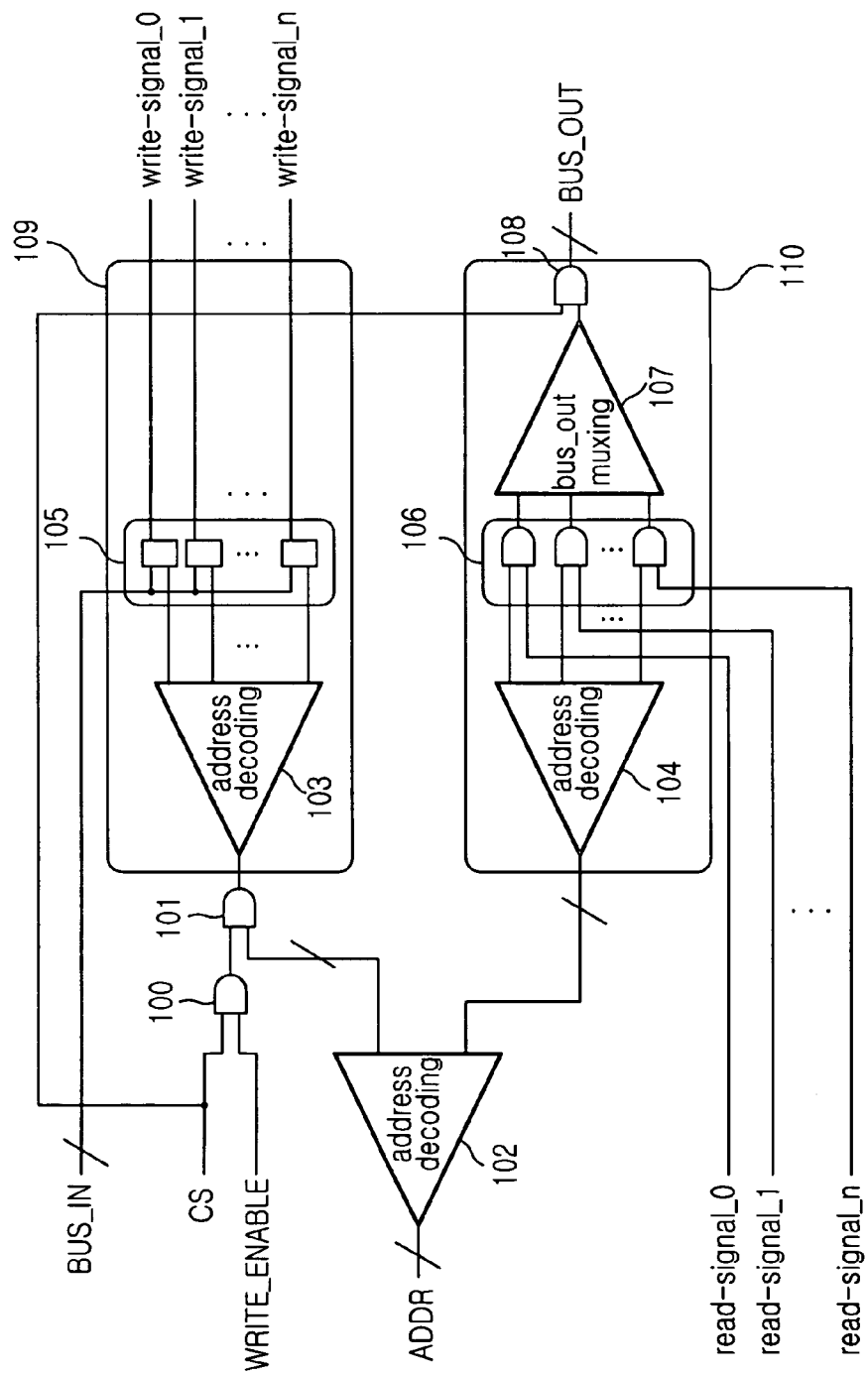
FIG. 1 illustrates the configuration of a register module in a conventional one-way gating structure.
Figure 2:
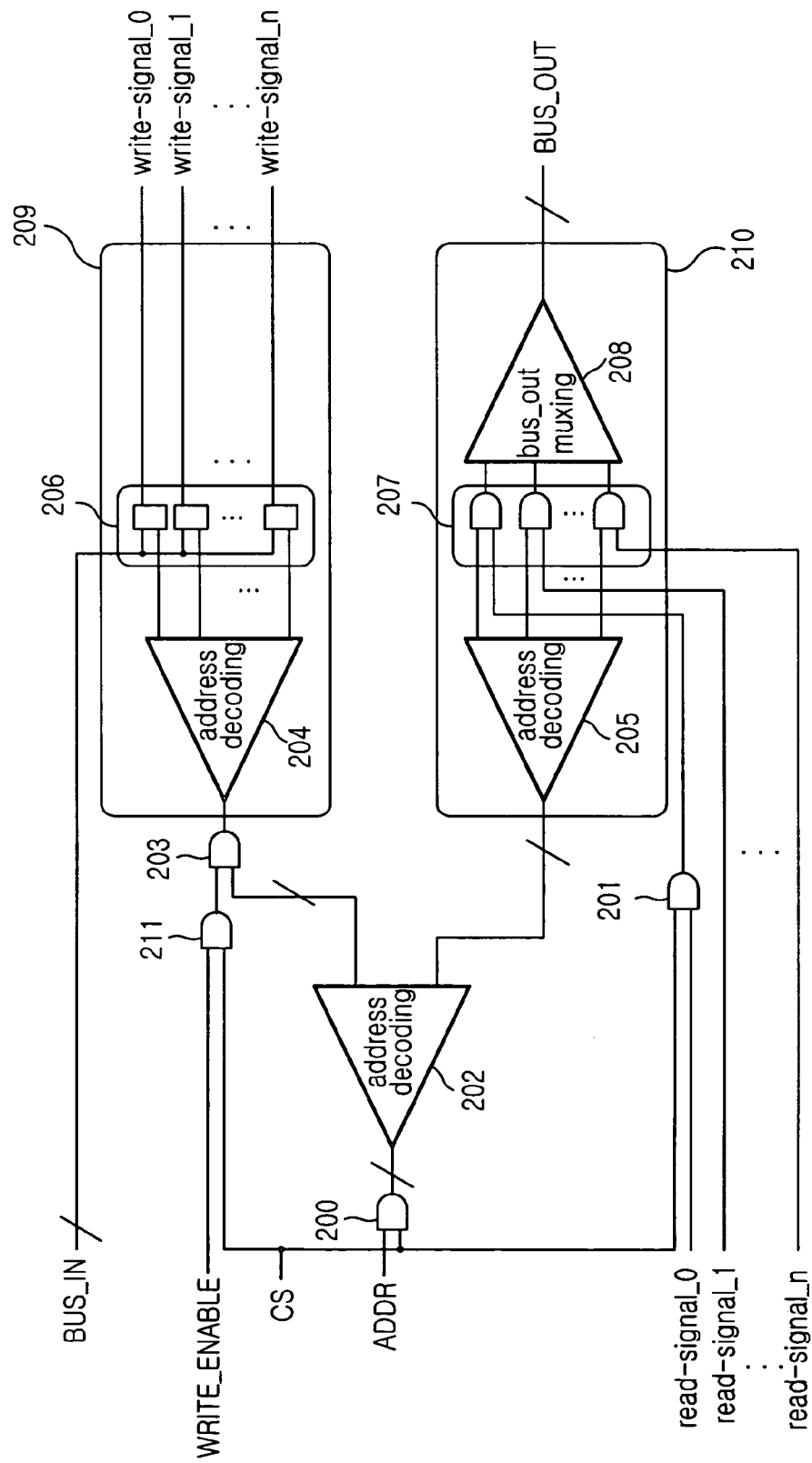
FIG. 2 illustrates the configuration of another register module in the conventional one-way gating structure.
Figure 3:
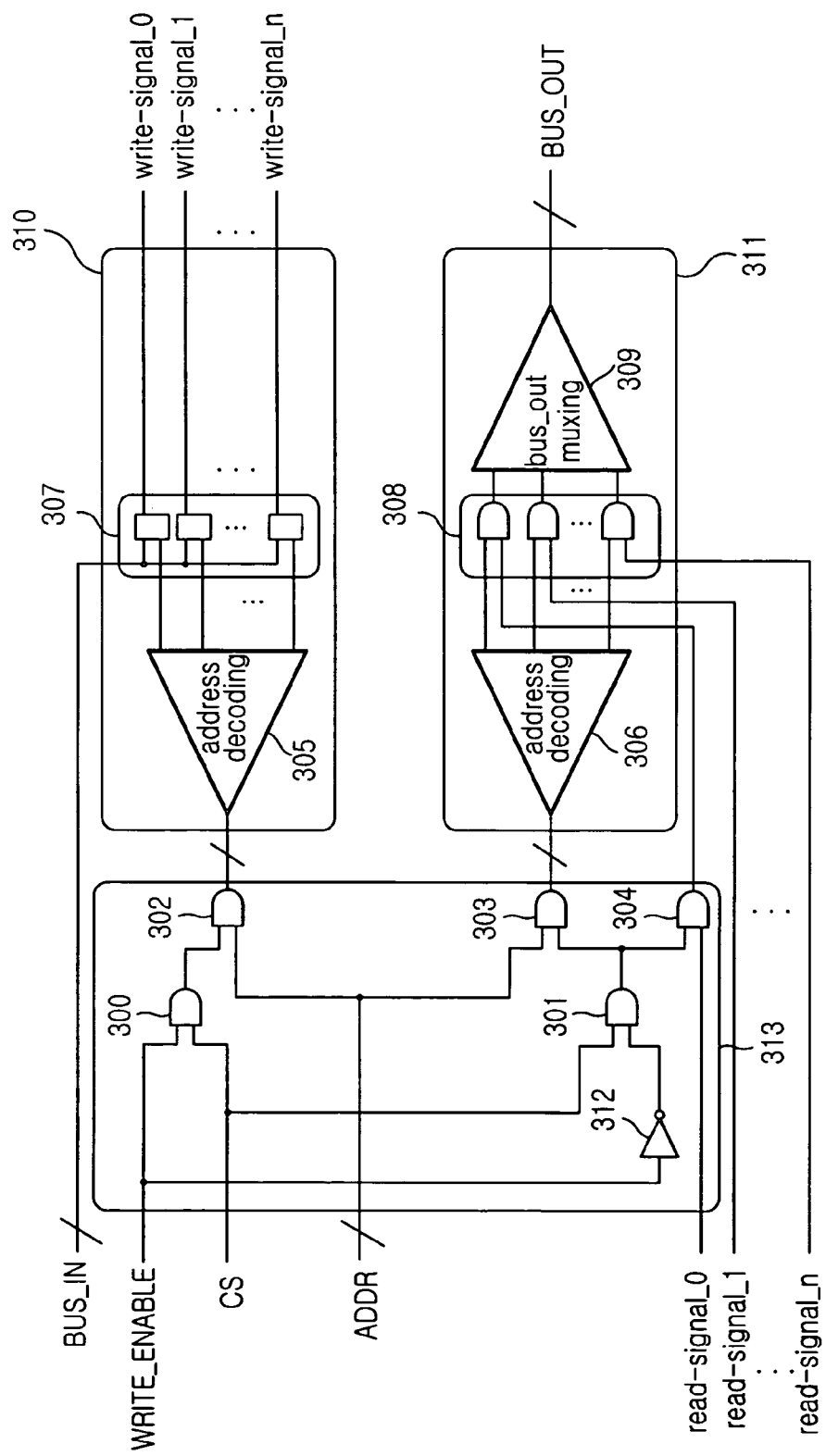
FIG. 3 illustrates the configuration of a register module in a two-way gating structure according to an embodiment of the present invention.

FIG. 3 illustrates the configuration of a register module having a two-way gating structure according to an embodiment of the present invention. Referring to FIG. 3, the register module comprises a two-way gating portion 313, a writer 310, and a reader 311. The operation of each block for read and write functionality when CS is enabled for the register module will now be described separately from its operation when the CS signal is disabled. Gating logics in the register module are implemented as AND gates.

A write operation when CS is enabled for the register module will now be described. At a write operation, WRITE_enable is enabled. Each AND gate illustrated in FIG. 3 is actually a unit having a plurality of AND gates. This AND gate is termed a gating logic.

A gating logic 300 is activated by CS and WRITE_enable. When ADDR is enabled, a gating logic 302 for writing activates a write address decoder 305 using the output of the gating logic 300 and ADDR. It can be said that ADDR is encoded by the gating logic 302. Therefore, the write address decoder 305 outputs decoded write addresses by the coded ADDR. The output of the write address decoder 305 enables a load enable (LE) signal, at a predetermined address by data received from a bus. With the enabled load enable signal, BUS_IN is written in a register. Then, the writer 310 outputs write data, write-signal_0, write-signal_1, up to write-signal_n.

Regarding the operation of the reader 311 during the write operation, an inverter 312 inverts WRITE_enable, thus deactivating a gating logic 301. Hence, a gating logic 303 for reading, which is the counterpart of the gating logic 302 in two-way gating, and a gating logic 304 for gating read-signal_0 are deactivated. As a result, none of the logics of the reader 311 operate.

A read operation when CS is enabled will now be described. At a read operation, WRITE_enable is disabled.

The inverter 312 inverts the disabled signal, WRITE_enable and provides the inverted signal to the gating logic 301. The gating logic 301 activates the gating logics 303 and 304 using CS and the inverted WRITE_enable. Thus, when ADDR is enabled, ADDR is provided to a read address decoder 306 via the gating logic 303. The ADDR input to the read address decoder 306 from the gating logic 303 is an encoded ADDR. This encoded ADDR activates the read address decoder 306 and activates a corresponding AND gate in a read gating logic 308. The read address decoder 306 decodes read addresses by the encoded ADDR. In the case of a read and write address, data read at the read addresses are provided to and activates a bus output MUX 309. The activated bus output MUX 309 outputs BUS_OUT. BUS_OUT is used at the next stage (not shown), satisfying the read function because the register module is current in a read state.

Regarding the operation of the writer 310 during the read operation, since WRITE_enable is not activated, the gating logic 300 is deactivated by WRITE_enable and CS. As one of the two-way gating logics, thus, the gating logic 302 for writing is deactivated. As a result, ADDR is not provided to the write address decoder 305. That is, none of the logics of the writer 310 operate.

Finally, the operation of each block when CS is not enabled will now be described.

Because CS is not enabled, neither the gating logic 300 nor the gating logic 301 is activated. Thus, even if ADDR is enabled, either of the two-way gating logics 302 and 303 is not activated and either of the writer 310 and the reader 311 at the rear end is not activated. Therefore, the continuous power consumption as encountered with the conventional technology does not occur.

Figure 4:
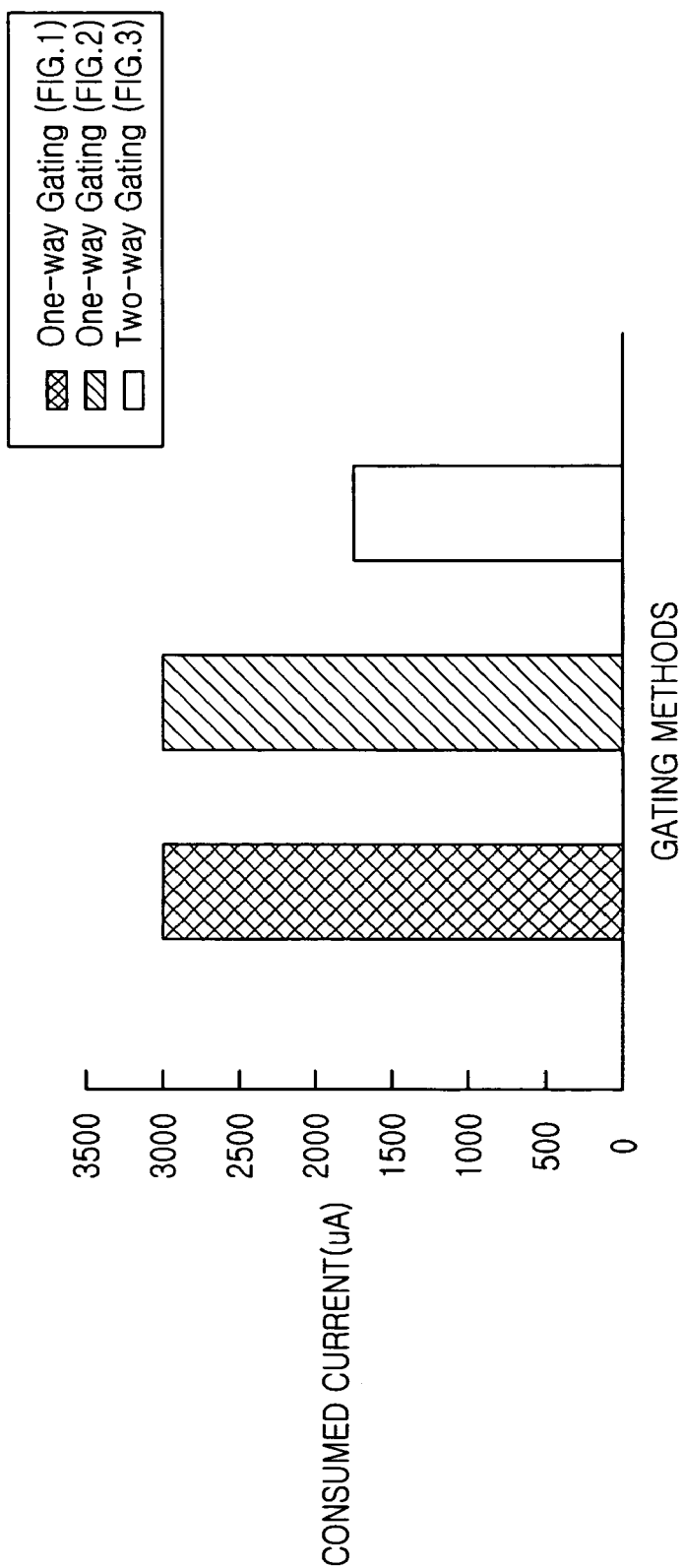
FIG. 4 illustrates simulation results comparing two conventional one-way gating methods and the two-way gating method of the present invention.

FIG. 4 illustrates the results of a simulation comparing power consumption of the two conventional one-way gating methods with the two-way gating method according to an embodiment of the present invention. A register module having an 8-bit read and write structure with 128 addresses was simulated to investigate maximum power consumption during a write operation when CS is enabled. As noted from FIG. 4, the two-way gating method results in a 38% or higher power consumption decrease relative to the conventional one-way gating methods.

A trend observed in almost all recently developed computers is System On Chip (SOC) for integrating a large number of peripheral devices as well as a general-purpose processor such as a CPU to satisfy various demands and implement various functions. Such a chip is provided with a register module for each peripheral device. Application of the two-way gating according to an embodiment of the present invention to the register module results in reduced power consumption. From the perspective of the chip, power consumption is substantially reduced.

In accordance with an embodiment of the present invention as described above, address decoding is performed separately for a writer and for a reader in a register module, thus configuring a two-way gating structure by which each decoding logic can be gated. Due to the separation between writing and reading, the two-way gating structure solves the problem of continuous power consumption caused by unnecessary operation of logic circuits.

While the invention has been shown and described with reference to a certain embodiment thereof, it is a mere exemplary application. The two-way gating technology of the present invention is not limited to register modules but is applicable to any other module that performs a predetermined function using addresses. Thus, it should be understood by those skilled in the art that various changes in form and details may be made therein without departing from the spirit and scope of the invention as defined by the appended claims.

What is claimed is:

1. A register apparatus having a two-way gating structure that receives a write enable signal, a chip select signal, at least one read signal, and an address signal for a register, comprising:

a two-way gating portion for generating a coded write address by AND-operating a first signal with the address signal, the first signal being generated by AND-operating the chip select signal with the write enable signal, generating a coded read address by AND-operating a second signal with the address signal, the second signal being generated by AND-operating the chip select signal with an inverted signal of the write enable signal, and generating a reader activation signal by AND-operating the at least one read signal with the second signal;

a writer for receiving the coded write address, decoding the coded write address, writing data using the decoded write address and the data received from a bus; and a reader for receiving the coded read address, decoding the coded read address, and outputting read signal to the bus using read signals and the decoded read address.

2. The register apparatus of claim 1, wherein the two-way gating portion comprises:

a first gating logic for receiving the chip select signal and the write enable signal;

a second gating logic for activating the reader by the output of the first gating logic and the address signal for the register;

an inverter for receiving the write enable signal;

a third gating logic for receiving the chip select signal and the output of the inverter;

a fourth gating logic for activating the reader by the address signal for the register and the output of the third gating logic; and a fifth gating logic for generating the reader activation signal by AND-operating the output of the third gating logic with the at least one read signal, to selectively activate the reader.

3. The register apparatus of claim 1, wherein the writer comprises:

a write address decoder for decoding the coded write address received from the two-way gating portion; and a write register for writing data by using the output of the write address decoder with the data received from the bus.

4. The register apparatus of claim 1, wherein the reader comprises:

a read address decoder for decoding the coded read address received from the two-way gating portion; and a read gating portion for outputting at least one read signal by AND-operating the read signal with the decoded read address; and a multiplexer for multiplexing the output of the read gating portion and outputting the multiplexed signal to the bus.

5. The register apparatus of claim 4, wherein the read gating portion includes as many AND gates as the size of the read signal.

6. A method for receiving a write enable signal, a chip select signal, at least one read signal, and an address signal for a register using a two-way gating structure, the method comprises:

generating via a two-way gating portion a coded write address by AND-operating a first signal with the address signal, the first signal being generated by AND-operating the chip select signal with the write enable signal, generating a coded read address by AND-operating a second signal with the address signal, the second signal being generated by AND-operating the chip select signal with an inverted signal of the write enable signal, and generating a reader activation signal by AND-operating the at least one read signal with the second signal;

receiving via a writer the coded write address, decoding the coded write address, writing data using the decoded write address and the data received from a bus; and receiving via a reader the coded read address, decoding the coded read address, and outputting read signal to the bus using read signals and the decoded read address.

7. The method of claim 6, wherein the step of generating via the two-way gating portion further comprises:
   receiving the chip select signal and the write enable signal via a first gating logic;
   activating the reader by the output of the first gating logic and the address signal for the register via a second gating logic;
   receiving the write enable signal via an inverter;
   receiving the chip select signal and the output of the inverter via a third gating logic;
   activating the reader by the address signal for the register and the output of the third gating logic via a fourth gating logic; and
   generating the reader activation signal by AND-operating the output of the third gating logic with the at least one read signal, to selectively activate the reader via a fifth gating logic.

8. The method of claim 6, wherein the step of receiving via the writer further comprises:
   decoding the coded write address received from the two-way gating portion via a write address decoder; and
   writing data by using the output of the write address decoder with the data received from the bus a write register.

9. The method of claim 6, wherein the step of receiving via the reader comprises:
   decoding the coded read address received from the two-way gating portion via a read address decoder; and
   outputting at least one read signal by AND-operating the read signal with the decoded read address via a read gating portion; and
   multiplexing the output of the read gating portion and outputting the multiplexed signal to the bus via a multiplexer.

10. The method of claim 9, wherein the read gating portion comprises as many AND gates as the size of the read signal.

* * * * *